(12) United States Patent
Ono

(10) Patent No.: US 8,324,709 B2
(45) Date of Patent: Dec. 4, 2012

(54) SEMICONDUCTOR DEVICE

(75) Inventor: Atsuki Ono, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/137,199

(22) Filed: Jul. 27, 2011

(65) Prior Publication Data

US 2011/0278695 A1   Nov. 17, 2011

Related U.S. Application Data

(63) Continuation of application No. 12/292,210, filed on Nov. 13, 2008, now Pat. No. 8,013,421.

(30) Foreign Application Priority Data

Dec. 10, 2007   (JP) ................. 2007-318721

(51) Int. Cl.
  *H01L 23/525*   (2006.01)
(52) U.S. Cl. ...................... 257/529; 365/200
(58) Field of Classification Search .............. 257/48, 257/50, 173, 179, 209, 529, 620, 665, 797, 257/E21.532; 438/132, 251, 281, 333, 467, 438/601, FOR. 433
See application file for complete search history.

(56) References Cited

U.S. PATENT DOCUMENTS

| | | | |
|---|---|---|---|
| 4,064,493 A | 12/1977 | Davis | |
| 6,661,330 B1 | 12/2003 | Young | |
| 7,282,751 B2 | 10/2007 | Ueda | |
| 2003/0155590 A1 | 8/2003 | Hatano et al. | |
| 2004/0262710 A1 | 12/2004 | Ueda | |
| 2005/0029620 A1* | 2/2005 | Ueda | 257/529 |
| 2007/0222029 A1 | 9/2007 | Ueda | |
| 2007/0262414 A1* | 11/2007 | Ueda | 257/529 |
| 2007/0278616 A1* | 12/2007 | Ueda | 257/529 |
| 2007/0280012 A1* | 12/2007 | Obayashi et al. | 365/200 |

FOREIGN PATENT DOCUMENTS

| | | |
|---|---|---|
| JP | 2005-039220 | 2/2005 |
| JP | 2005-057186 | 3/2005 |
| JP | 2006-253237 | 9/2006 |

* cited by examiner

*Primary Examiner* — Marcos D. Pizarro
*Assistant Examiner* — Suian Tang
(74) *Attorney, Agent, or Firm* — McGinn IP Law Group, PLLC

(57) ABSTRACT

A semiconductor device has an electrical fuse formed on a substrate, having a first interconnect, a second interconnect respectively formed in different layers, and a via provided in a layer between the first interconnect and the second interconnect, connected to one end of the second interconnect and connected also to the first interconnect; and a guard interconnect portion formed in the same layer with the second interconnect, so as to surround such one end of the second interconnect, wherein, in a plan view, the second interconnect is formed so as to extend from the other end towards such one end, and the guard interconnect portion is formed so as to surround such one end of the second interconnect in three directions, while placing such one end at the center thereof.

15 Claims, 12 Drawing Sheets

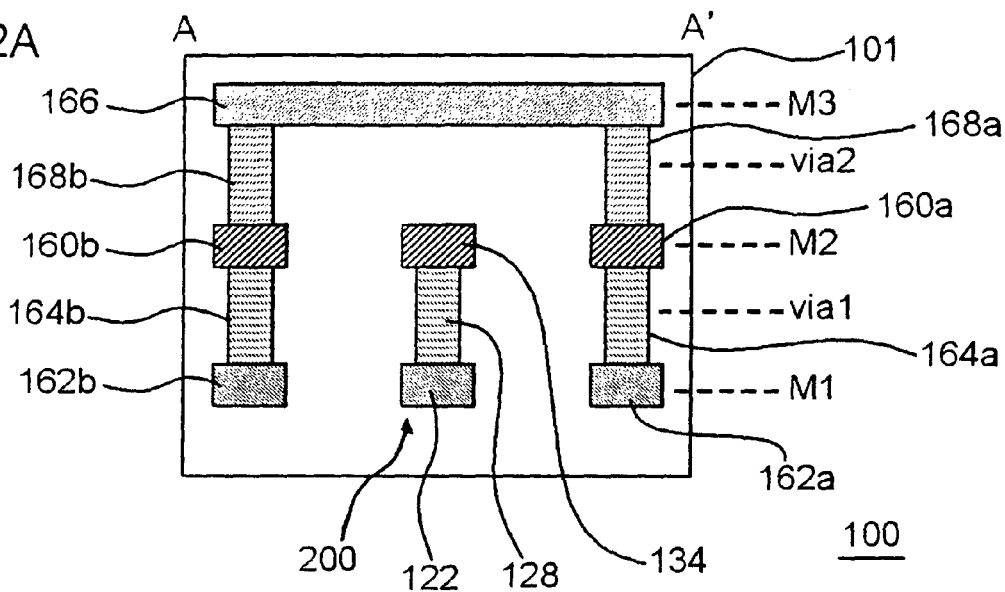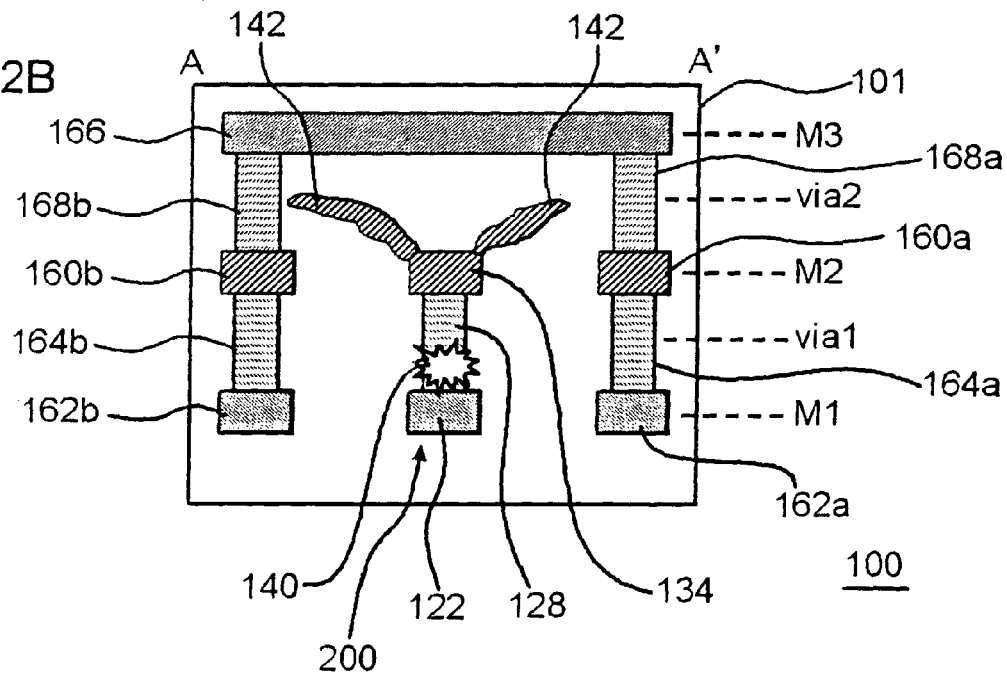

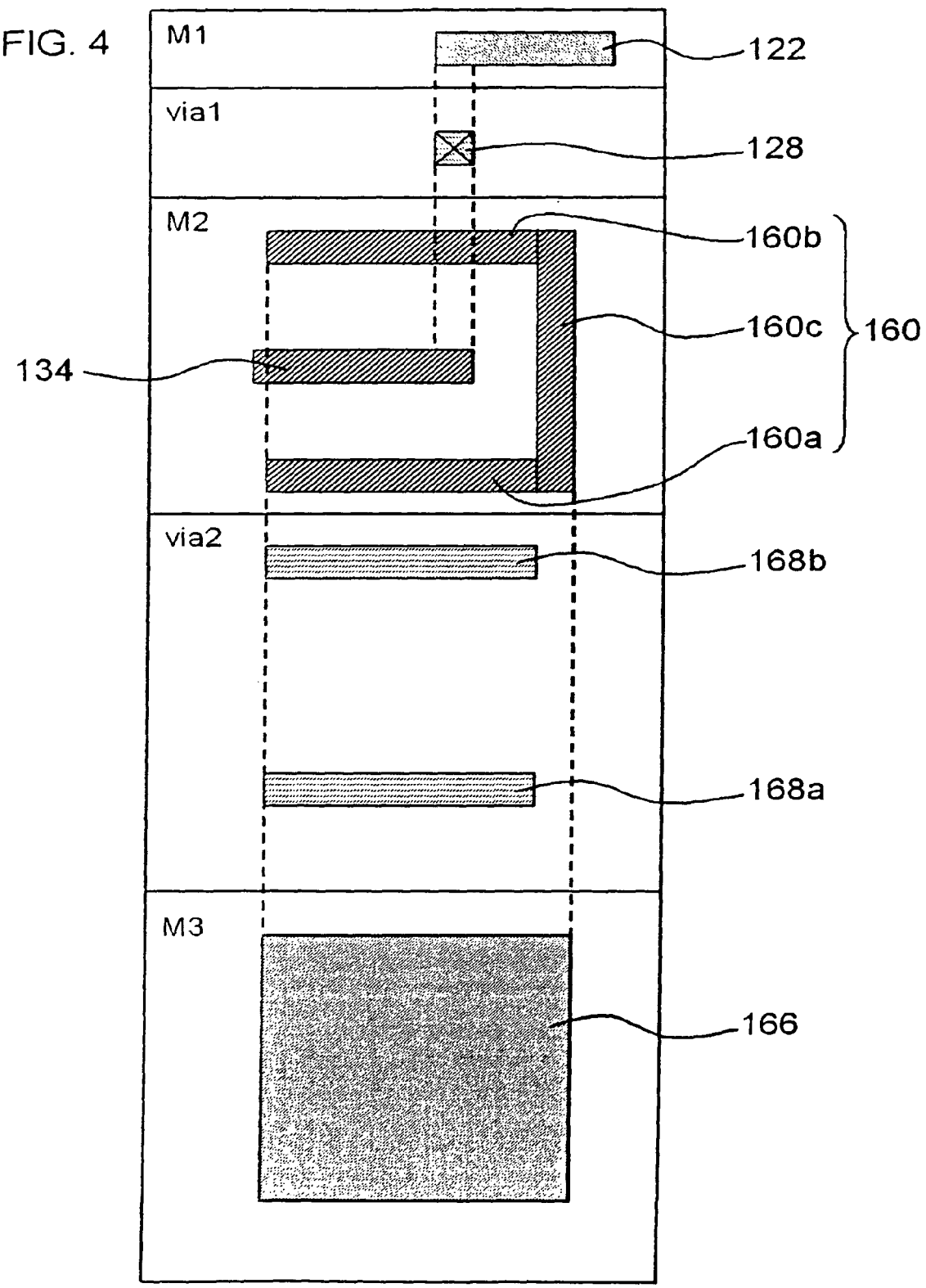

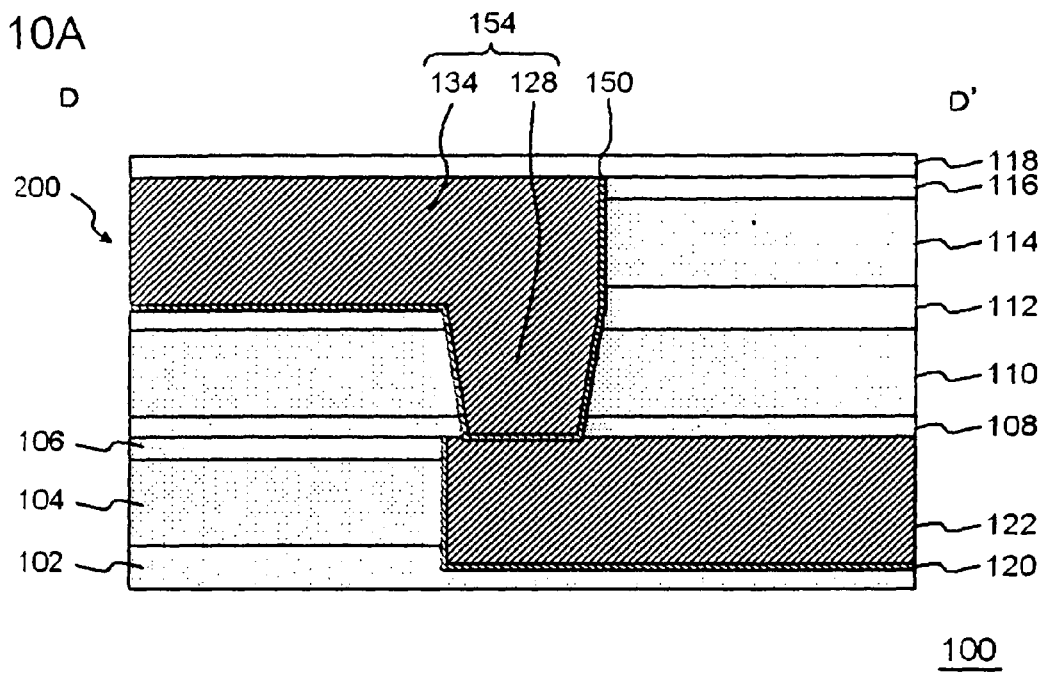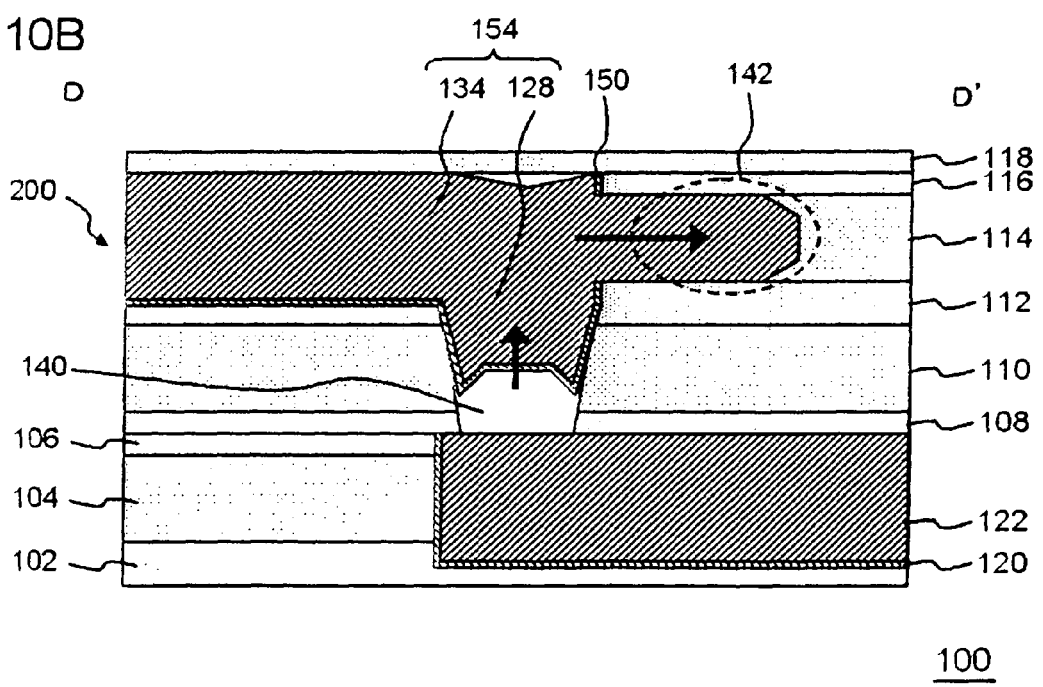

SEMICONDUCTOR DEVICE

This application is a continuation application of U.S. patent application Ser. No. 12/292,210, filed on Nov. 13, 2008, now U.S. Pat. No. 8,013,421.

This application is based on and claims priority to Japanese patent application No. 2007-318721 the content of which is incorporated hereinto by reference.

BACKGROUND

1. Technical Field

The present invention relates to a semiconductor device, and in particular to a semiconductor device containing an electrical fuse.

2. Related Art

There has conventionally been known a technique of preliminarily mounting a fuse to a semiconductor device, and disconnecting the fuse, in order to adjust resistivity of resistors used therein, or to disconnect an unacceptable element and replace it with a normal element.

Methods of disconnection of the fuse include a method of disconnecting the fuse by irradiating laser beam to a portion of the fuse, and a method of disconnecting the fuse with the aid of electric current.

U.S. Pat. No. 4,064,493, Japanese Laid-Open Patent Publication Nos. 2005-39220, 2005-57186 and 2006-253237 disclose electrical fuses disconnectable making use of a phenomenon such that a material composing the fuse moves based on electro-migration.

Japanese Laid-Open Patent Publication No. 2005-39220 discloses a fuse disconnectable with a smaller energy of current. In this publication, an electroconductive material composing the fuse is patterned while being folded a plurality of number of times. FIG. 12 is plan view showing the fuse disclosed in this publication. A fuse 1100 herein is folded twice.

The fuse 1100 has a current input terminal 1101, a current output terminal 1102, and between both terminals, a first forward straight portion 1103, a return straight portion 1104, and a second forward straight portion 1113. The fuse 1100 has also a first right-angled connection portion 1106 connecting the first forward straight portion 1103 and the return straight portion 1104, and a second right-angled connection portion 1107 connecting the second forward straight portion 1113 and the return straight portion 1104. When a predetermined current is allowed to flow from the current input terminal 1101 towards the current output terminal 1102 in thus-configured fuse 1100, heat generated in outer hatched portions 1108 of the fuse 1100 is summed up with heat generated in inner hatched portions 1109 of the fuse 1100, so that disconnection of the return straight portion 1104 fallen between the inner hatched portions 1109 is accelerated. The fuse 1100 may readily be disconnected in this way.

Japanese Laid-Open Patent Publication No. 2005-57186 describes a configuration in which lower and upper portions of a site of disconnection are covered with plates, and side portions are covered with vias. By virtue of this configuration, heat generated at the site of disconnection, when current is allowed to flow through the fuse, may successfully be confined or stored in the vicinity of the site of disconnection.

Japanese Laid-Open Patent Publication No. 2006-253237 describes a fuse element composed of a first interconnect, a second interconnect formed above the first interconnect while placing an insulating film in between, and a first via formed in the insulating film so as to connect the first interconnect and the second interconnect. The main portion of the first via is composed of a material more readily cause electro-migration than that composing the individual main portions of the first interconnect and the second interconnect. The publication also describes a configuration having a heater interconnect for heating the via provided therearound. This configuration reportedly allows elevation of temperature around the via in the process of disconnection, and is thereby capable of efficiently disconnecting the via.

The conventional configurations of the electrical fuse have, however, been anticipated for causing short-circuiting within the fuse, or between the fuse and the peripheral element thereof, in the process of disconnection of the fuse. In the technique disclosed in Japanese Laid-Open Patent Publication No. 2005-57186, the vias are formed on the lateral side of the interconnects, but the short-circuiting between the interconnects could not have been avoidable because of closely-adjacent arrangement of the ends of the interconnects composing the fuse. In the technique disclosed in Japanese Laid-Open Patent Publication No. 2006-253237, the heater interconnect is provided around the via portion, but the short-circuiting again could not have been avoidable when a material composing the interconnect is melt down, because there is no member protecting the interconnect formed therearound.

For the case where the fuse is disconnected making use of a phenomenon such that a material composing the fuse moves based on electro-migration as described in U.S. Pat. No. 4,064,493, Japanese Laid-Open Patent Publication Nos. 2005-39220, 2005-57186 and 2006-253237, any annealing given to the semiconductor device after disconnection of the fuse may cause re-movement of the material based on electro-migration, and thereby the site of disconnection may again recover connection. If such re-connection should occur, a target electrical fuse once supposedly be disconnected may not correctly be judged, in the process of inspecting whether the electrical fuse has been disconnected or not. This sort of disconnection might occur not so often, and is not supposed to raise a serious problem so far as the fuse is used under general operation, but it may be necessary to further improve performance of keeping a desirable state of disconnection, for the case where the semiconductor device is requested to ensure an extremely advanced level of reliability, or operated under severe conditions.

SUMMARY

It has been found out a novel method of disconnection of the electrical fuse, by allowing the electroconductive material composing the electrical fuse to forcedly burst out at a portion of the electrical fuse in the process of disconnection, through consideration on a configuration of the electrical fuse, or through control of a method of applying voltage to the electrical fuse, so as to impair a balance between migration and supply of the material, to thereby form a large site of disconnection at some other portion. In this way, the state of disconnection of the disconnected electrical fuse may be kept in a desirable condition.

According to the method of disconnecting a fuse as such, a large site of disconnection may be formed at a site different from the site where the electroconductive material bursts out. Accordingly, the electrical fuse once disconnected may be far less likely to cause re-connection. On the other hand, it may be more important than before to prevent short-circuiting through the burst electroconductive material, because the amount of burst of electroconductive material will be large.

According to the present invention, there is provided a semiconductor device having:

a substrate;

an electrical fuse formed on the substrate, having a first interconnect and a second interconnect respectively formed in different layers, and a via provided in a layer between the first interconnect and the second interconnect, connected to one end of the second interconnect and connected also to the first interconnect; and a guard interconnect portion formed in the same layer with the second interconnect, so as to surround such one end of the second interconnect, wherein, in a plan view, the second interconnect is formed so as to extend from the other end towards such one end, and the guard interconnect portion is formed so as to surround such one end of the second interconnect in three directions, while placing such one end at the center thereof.

By virtue of this configuration, the electroconductive material may be guarded by the guard interconnect portion if the electroconductive material composing the electrical fuse should burst out from one end of the second interconnect in the process of disconnection, and thereby short-circuiting of the fuse with other elements or the like may be avoidable.

The electrical fuse of the present invention may be disconnected by the procedures below.

Current is allowed to flow by applying a predetermined voltage between the first interconnect and the second interconnect, so as to allow the electroconductive material composing the electrical fuse to burst out from the second interconnect, and to move the electroconductive material out from the via towards the direction of the second interconnect, and thereby a site of disconnection is formed between the via and the first interconnect, or in the via. In this process, the electroconductive material is likely to burst out from one end of the second interconnect, and the overflow portion is formed so as to extend beyond one end. According to the configuration of the semiconductor device of the present invention, the overflow portion is guarded by the guard interconnect portion even if it is formed so as to extend beyond one end of the second interconnect, so that the overflow portion may effectively be prevented from causing short-circuiting with other elements and so forth.

According to the present invention, short-circuiting anticipated when the electrical fuse is disconnected may be avoidable.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 2A and 2B are sectional views taken along line A-A' in FIG. 1;

FIG. 4 is a top view showing a configuration of the individual layers;

FIGS. 7A, 7B, 8A, 8B, 9A, 9B, 10A and 10B are drawings explaining operations in the process of crack-assisted disconnection of the electrical fuse;

DETAILED DESCRIPTION

Figure 1:
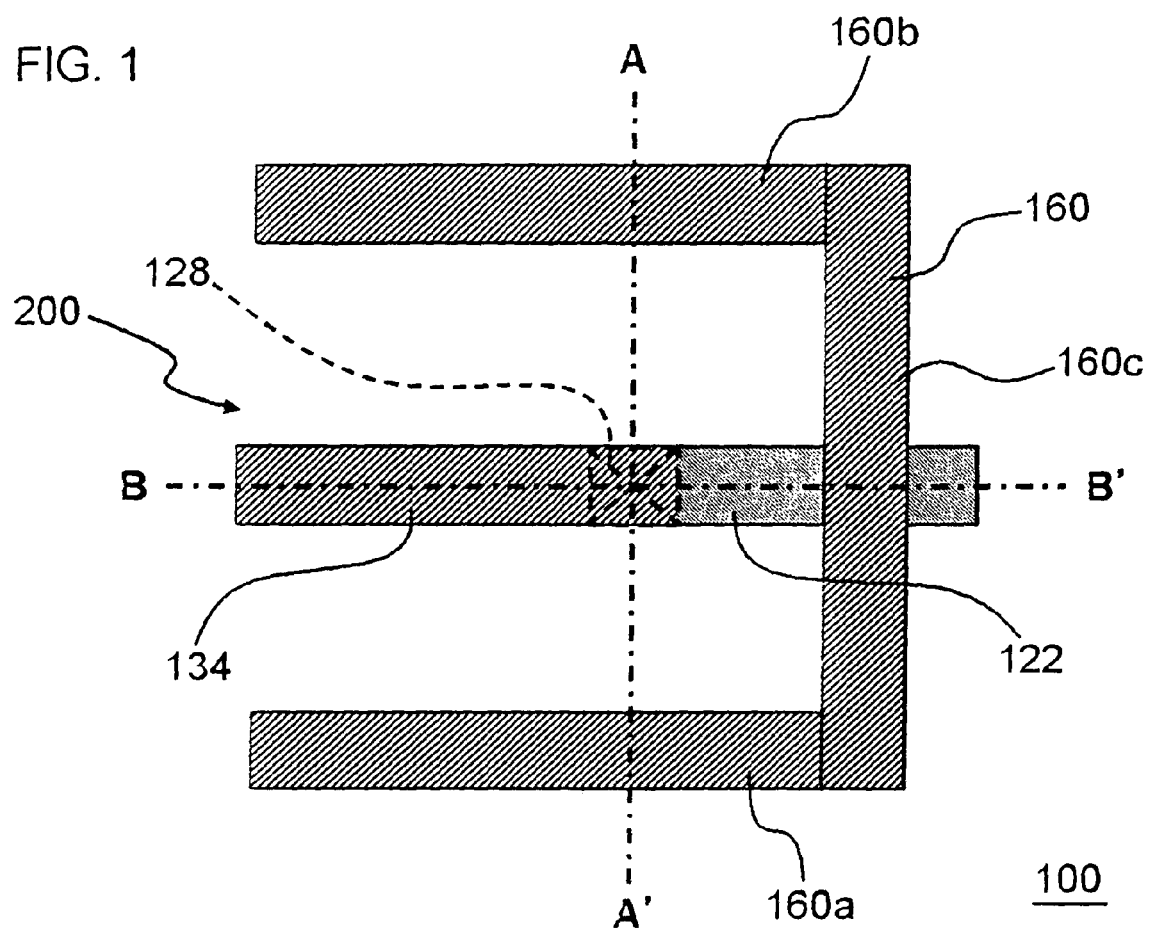
FIG. 1 is a schematic top view showing a configuration of a semiconductor device containing an electrical fuse of the present invention.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

In the embodiments below, any similar constituents will be given with similar reference numerals, so as to avoid repetitive explanation.

In an embodiment of the present invention, the electrical fuse may be configured by a stacked structure of an interconnect, a via, and again an interconnect. Each of these interconnects and the via may be configured as being formed in an insulating film. The interconnects and the via may be composed of copper-containing metal films containing copper as a major constituent. Each of the interconnects and the via may further be configured as being covered, on the side faces and the bottom surfaces thereof, with a barrier metal film. The surface of each interconnects may have a barrier insulating film formed thereon.

In this embodiment, thus-configured electrical fuse may be disconnected according to the procedures below.

(1) Excessive power is applied to the electrical fuse so as to excessively inject electrons typically from the upper interconnect, to thereby heat the interconnects and the via.

(2) The electroconductive material composing the heated interconnects and the via expands, and induces cracks in the peripheral insulating film and the barrier metal film. The cracks herein generate in the periphery of the interconnect having a larger area, in the in-plane direction of the semiconductor substrate (that is, the interconnect having a larger volume).

(3) The electroconductive material bursts into the cracks formed in the insulating film and the barrier metal film, and is consequently reduced in the density of itself.

(4) In conjunction therewith, the electroconductive material in the via portion having a smaller area in the in-plane direction of the semiconductor substrate (that is, the via portion having a smaller volume) is then suck up towards the direction into which the electroconductive material bursts. As a consequence, a site of disconnection is produced at the via portion, and thereby the electrical fuse is disconnected.

Figure 6:
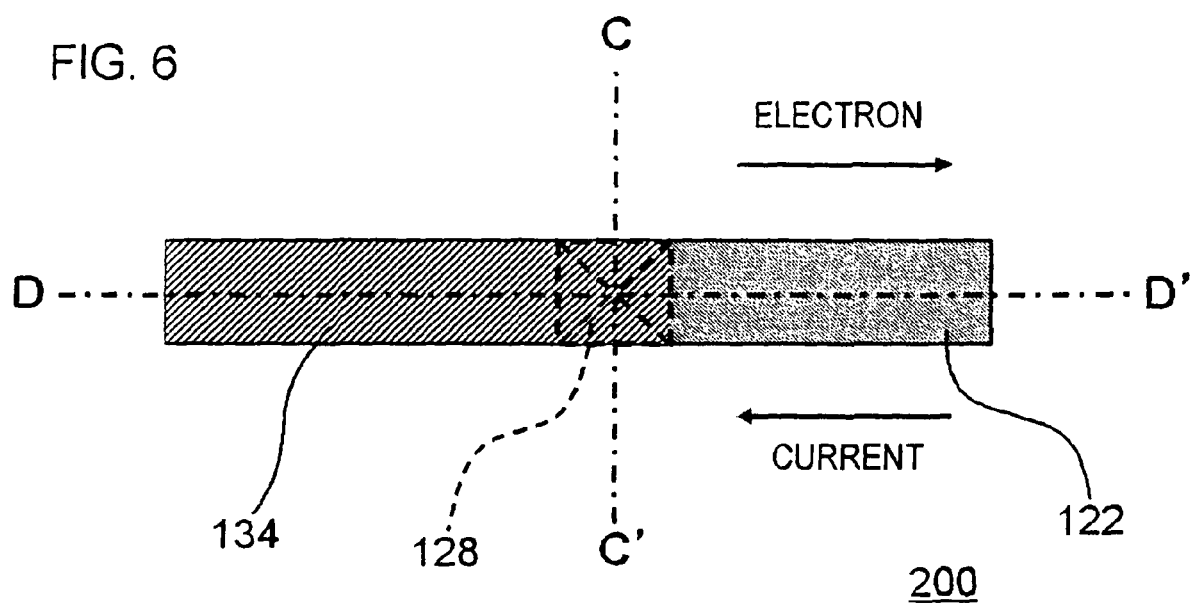
FIG. 6 is a drawing explaining an operation in the process of crack-assisted disconnection of the electrical fuse.
Figure 7A:
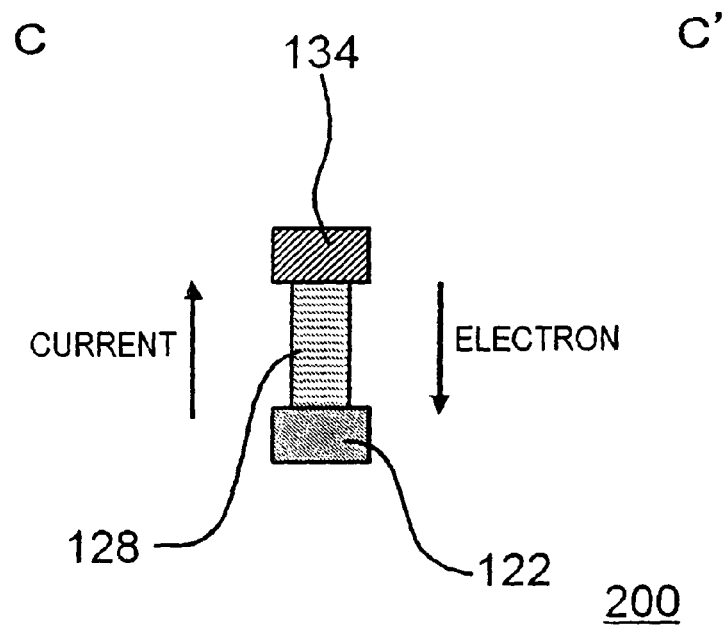
Figure 7B:
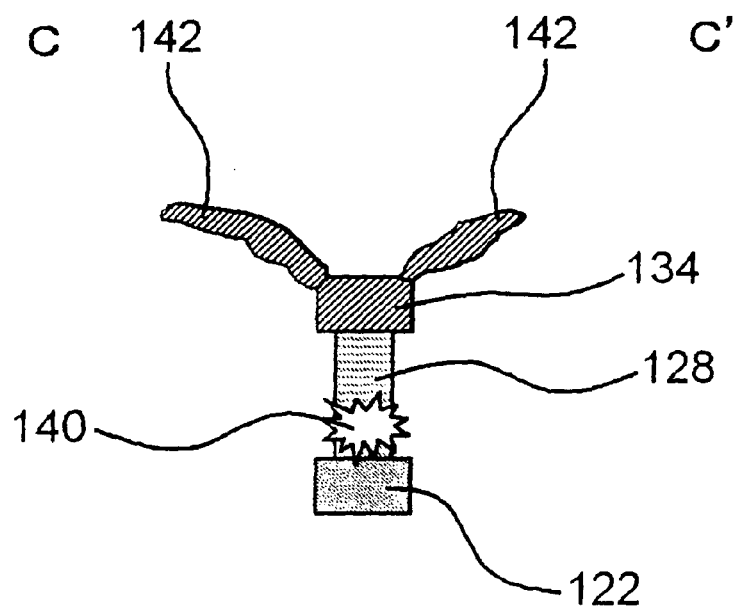
Figure 8A:
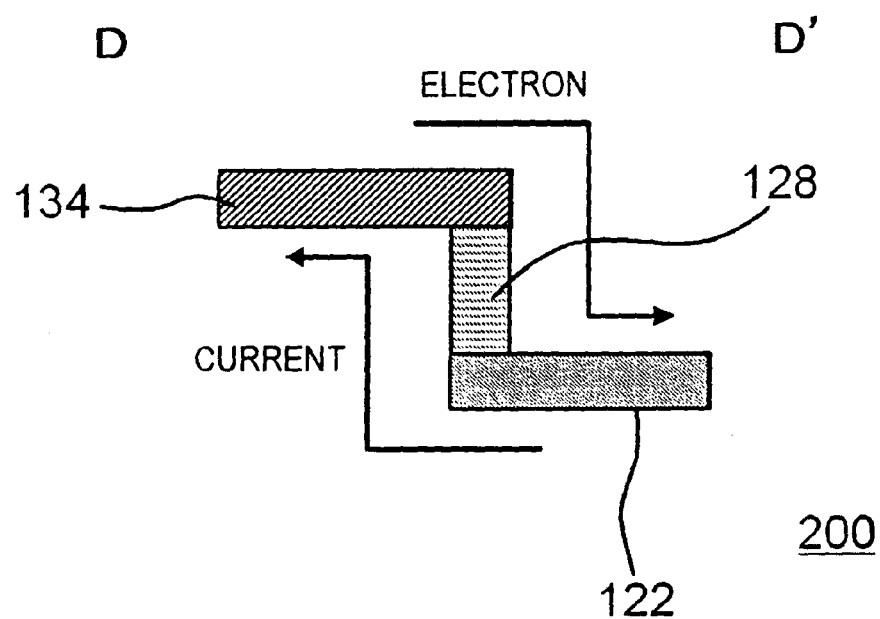
Figure 8B:
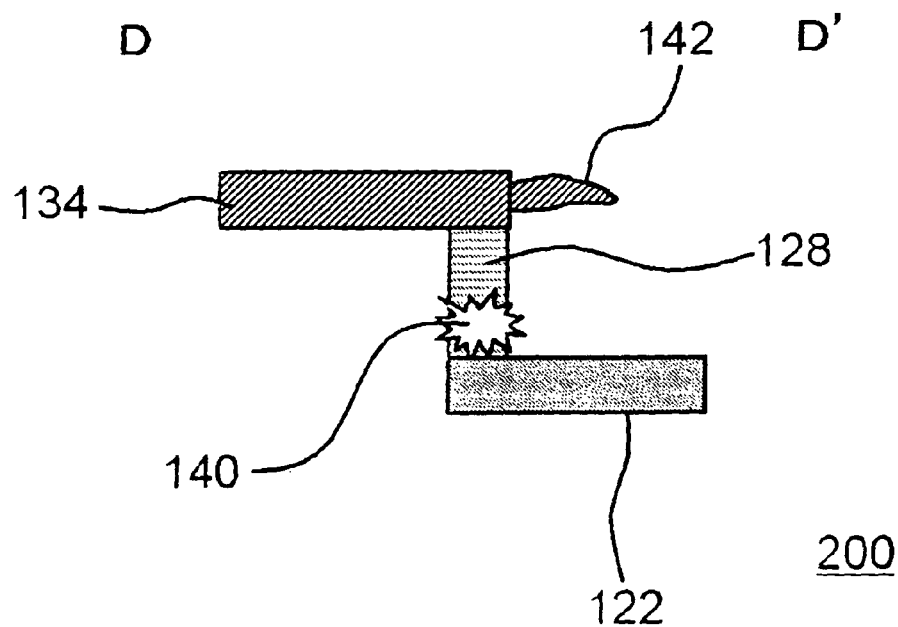

The method of disconnecting the electrical fuse based on the procedures in the above will be referred to as "crack-assisted" disconnection. Operations of the crack-assisted disconnection of electrical fuse will be explained referring to FIGS. 6, 7A, 7B, 8A, 8B, 9A, 9B and 10. FIG. 6 is a schematic top view showing a configuration of an electrical fuse 200 in this embodiment. FIGS. 7A and 7B are sectional views taken along line C-C' in FIG. 6, and FIGS. 8A and 8B are sectional views taken along line D-D' in FIG. 6. FIG. 7A and FIG. 8A show the state before disconnection of the electrical fuse 200, and FIG. 7B and FIG. 8B show the state after disconnection of the electrical fuse 200.

The electrical fuse 200 contains a first interconnect 122 and a second interconnect 134 respectively formed in different layers on a semiconductor substrate (substrate), and a via 128 formed in a layer between the first interconnect 122 and the second interconnect 134, connected to one end of the second interconnect 134 and also to the first interconnect 122. The semiconductor substrate may be a silicon substrate. As shown in FIG. 7A and FIG. 8A, the first interconnect 122, the via 128, and the second interconnect 134 in this embodiment are formed in this order from the bottom. In the state before disconnection, the first interconnect 122 and the second interconnect 134 are electrically connected through the via 128 formed therebetween.

In this embodiment, the second interconnect 134 has a volume larger than that of the first interconnect 122. For example, assuming now that the first interconnect 122 and the second interconnect 134 have an almost same thickness, the second interconnect 134 is formed so as to have a larger area in the in-plane direction of the semiconductor substrate, than an area in the in-plane direction of the semiconductor substrate of the first interconnect 122.

In this embodiment, the electrical fuse 200 is a so-called E fuse, disconnected by melt-down of the electroconductive material composing thereof, when electric current is allowed to flow from the first interconnect 122 through the via 128 towards the second interconnect 134. In the process of disconnection of the electrical fuse 200, the first interconnect 122 is set to a higher voltage (Vcc, for example), and the second interconnect 134 is set to a lower voltage (ground voltage, for example). A voltage of typically 2 to 5 V or around is applied between the first interconnect 122 and the second interconnect 134. In this way, an excessive power is applied between the first interconnect 122 and the second interconnect 134, and the current flows in the direction from the first interconnect 122 towards the second interconnect 134. As a consequence, an electroconductive material composing the first interconnect 122, the via 128, and the second interconnect 134 expands. The heated electroconductive material exerts its largest force around the second interconnect 134 having the largest volume. Cracks are therefore formed around the second interconnect 134, and the electroconductive material composing the electrical fuse 200 bursts out through the cracks to thereby form overflow portions 142.

Electrons herein move in the direction from the second interconnect 134 towards the first interconnect 122 (see FIG. 7A and FIG. 8A). Therefore, the electroconductive material heated at the second interconnect 134 exerts its largest force in the direction of moving of electrons. As a consequence, as shown in FIG. 8B, the overflow portions 142 are most readily formed so as to extend beyond the one end of the second interconnect 134 where the via 128 is connected. Alternatively, as shown in FIG. 7B, the overflow portions 142 may be formed on the lateral side, or on the lateral upper side.

When the overflow portions 142 are formed at the second interconnect 134, the electroconductive material migrates towards the overflow portions 142, and thereby the electroconductive material composing the via 128 is sucked up towards the overflow portions 142. As a consequence, a site of disconnection (void) 140 is formed in the via 128 portion (see FIG. 7B and FIG. 8B).

Figure 9A:
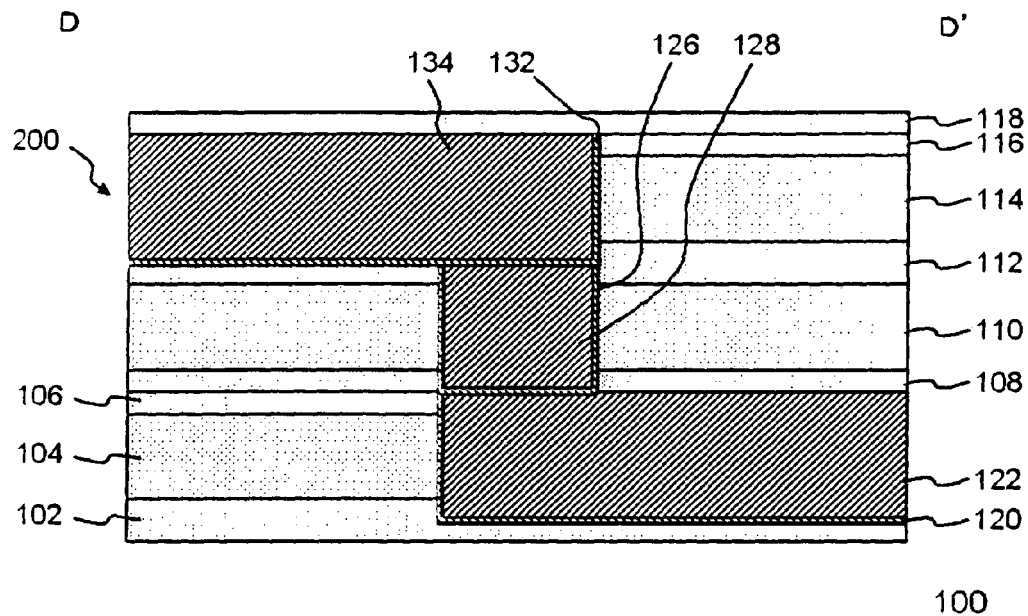
Figure 9B:
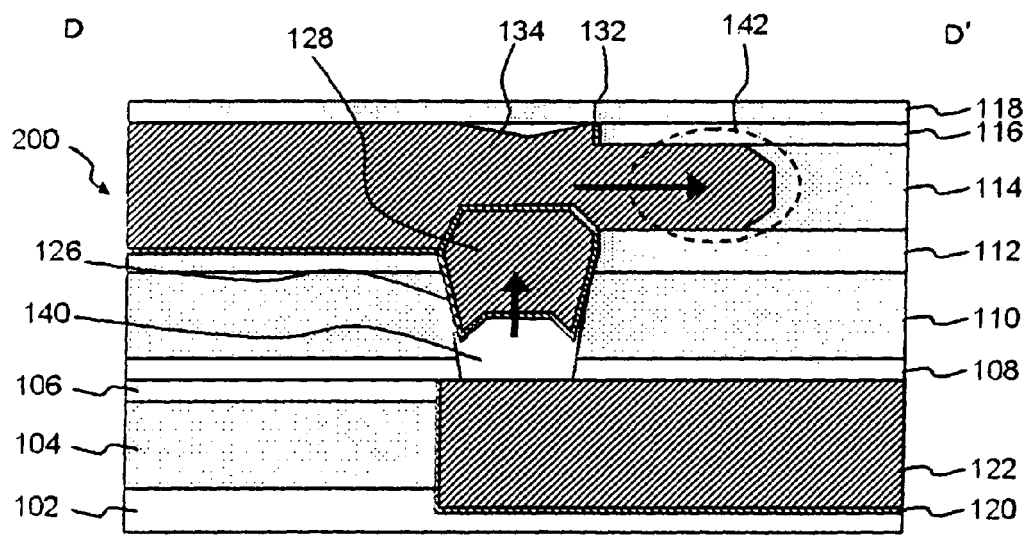

FIGS. 9A and 9B are sectional views specifically showing a configuration of a semiconductor device 100 having the electrical fuse 200 shown in FIG. 8 incorporated therein. FIG. 9A shows the state before disconnection, and FIG. 9B shows the state after disconnection. The description herein will be made referring to an exemplary case where the electrical fuse 200 has a single-damascene-type interconnect structure.

As shown in FIG. 9A, the semiconductor device 100 contains a semiconductor substrate (not shown), and a first etching stopper film 101, a first insulating interlayer 104, a first protective film 105, a second etching stopper film 107, a second insulating interlayer 110, a third etching stopper film 111, a third insulating interlayer 114, a second protective film 115 and a fourth etching stopper film 117 formed in this order on the semiconductor substrate.

The first interconnect 122 is formed in the first etching stopper film 101, the first insulating interlayer 104 and the first protective film 105. The via 128 is formed in the second etching stopper film 107, the second insulating interlayer 110 and the third etching stopper film 111. The second interconnect 134 is formed in the third etching stopper film 111, the third insulating interlayer 114 and the second protective film 115.

Each of the first interconnect 122, the via 128, and the second interconnect 134 may be configured by using a copper-containing metal film containing copper as a major constituent. The copper-containing metal film may contain silver. Still alternatively, the copper-containing metal film may also be configured as containing any one, or two or more different elements selected from the group consisting of Al, Au, Pt, Cr, Mo, W, Mg, Be, Zn, Pd, Cd, Hg, Si, Zr, Ti and Sn. The copper-containing metal film may be formed by plating. The copper-containing metal film may have, for example, a silicide film formed on the surface thereof.

In addition, the first interconnect 122, the via 128, and the second interconnect 134 have, on the side faces and the bottom surfaces thereof, the first barrier metal film 119, second barrier metal film 125, and third barrier metal film 131, respectively, provided while being brought into contact therewith so as to cover them. The barrier metal films may be configured as containing a refractory metal. The first barrier metal film 119, the second barrier metal film 125, and the third barrier metal film 131 may be configured typically by using Ta, TaN, Ti, TiN, W, WN and so forth.

In short, in the state before disconnection, the second barrier metal film 125 is provided between the first interconnect 122 and the via 128 as being brought into contact therewith. Further, the third barrier metal film 131 is provided between the via 128 and the second interconnect 134 as being brought into contact therewith.

The first insulating interlayer 104 and the third insulating interlayer 114 may be configured by using a low-k film such as SiOC film. Examples of the low-k film other than SiOC include poly-hydrogen siloxanes such as HSQ (hydrogen silsesquioxane), MSQ (methyl silsesquioxane), or MHSQ (methylated hydrogen silsesquioxane); organic materials containing aromatic compound such as poly(aryl ether) (PAE), divinyl siloxane-bis-benzocyclobutene (BCB), and Silk (registered trademark); SOG; FOX (flowable oxide), Cytop (registered trademark); and BCB (benzocyclobutene). Porous films of these materials may be applicable to the low-k film. The first insulating interlayer 104 and the third insulating interlayer 114 may be configured using the same material or different materials.

The second insulating interlayer 110 may be configured by using the materials same as those described for the first insulating interlayer 104 and the third insulating interlayer 114. The second insulating interlayer 110 herein is preferably configured by using a material relatively harder than those composing the first insulating interlayer 104 and the third insulating interlayer 114. For example, the second insulating interlayer 110 may be configured by using a material having a larger Young's modulus than those of the first insulating interlayer 104 and the third insulating interlayer 114. Such configuration facilitates formation of the overflow portion 142 at the interconnect portion.

Alternatively, without being limited to the above-described configuration, the second insulating interlayer 110 may be configured by using the same material with the first insulating interlayer 104 and the third insulating interlayer 114. Also in this case, the overflow portions 142 may be formed selectively at the interconnect portion, because the via 128 has only an extremely small area in the in-plane direction of the semiconductor substrate as compared with the interconnects.

The second etching stopper film 107 and the fourth etching stopper film 117 function as etching stopper films when the via holes and the interconnect trenches are formed, and function also as preventing copper composing the first interconnect 122 and the second interconnect 134 from diffusing. In this embodiment, the second etching stopper film 107 also functions as a coverage film for the electrical fuse 200. The second etching stopper film 107 and the fourth etching stopper film 117 may be configured by using a material harder than those composing the first insulating interlayer 104 and the third insulating interlayer 114. The second etching stopper film 107 and the fourth etching stopper film 117 may be configured by using a material having a larger Young's modulus than those composing the first insulating interlayer 104 and the third insulating interlayer 114. The second etching stopper film 108 and the fourth etching stopper film 118 may be configured typically by using SiCN, SiN, SiC, SiOF, SiON or the like.

The first protective film 106 and the second protective film 116 function as protecting the first insulating interlayer 104 and the third insulating interlayer 114, before the first interconnect 122 and the second interconnect 134 are respectively polished by CMP. The first protective film 106 and the second protective film 116 may be configured typically by using a SiO$_2$ film.

The first etching stopper film 102 and the third etching stopper film 112 may be configured by using a material same as that composing the second etching stopper film 108 and the fourth etching stopper film 118. Although not shown herein in the drawing, the first etching stopper film 102 and the third etching stopper film 112 may be a stacked film composed of a first insulating film composed of a material same as that composing the second etching stopper film 108 and the fourth etching stopper film 118, and a second insulating film formed thereon, composed of a material same as that composing the first protective film 106 and the second protective film 116.

Thus-configured first interconnect 122, the via 128, the second interconnect 134 and so forth may be formed by the same processes with those for forming general multi-layer structure. Accordingly, the electrical fuse 200 may be formed without adding any special processes.

A configuration obtainable herein may be such as having the second interconnect 134 covered by the coverage films such as the third barrier metal film 132, the fourth etching stopper film 118 and so forth, and further having the third insulating interlayer 114, which is a softer film than the coverage films, formed therearound. In addition, the second interconnect 134 is formed so as to have a larger area in the in-plane direction of the semiconductor substrate, than the via 128 and the first interconnect 122 have.

In thus-configured electrical fuse 200, when a predetermined voltage is applied between the first interconnect 122 and the second interconnect 134 so as to apply an excessive power to the electrical fuse 200, the electroconductive material composing the second interconnect 134 of the electrical fuse 200 expands, and swells into the direction of the third insulating interlayer 114 which is a soft film. As the electroconductive material expands, the third barrier metal film 132 and so forth cause cracks therein, and the electroconductive material composing the second interconnect 134 bursts out through the cracks into the third insulating interlayer 114. In other words, the electroconductive material composing the second interconnect 134 bursts out into the external of the interconnect trenches. As a consequence, the overflow portions 142 are formed as shown in FIG. 9B.

In addition, because the electroconductive material abruptly migrates towards the overflow portions 142, the electroconductive material is disconnected at a site where the electroconductive material could not catch up with the migration. In this embodiment, the electroconductive material is disconnected at the via 128, and the site of disconnection 140 is formed therein. According to this mechanism, a large site of disconnection 140 is formed at a site appropriately distant from the overflow portions 142.

This embodiment, having the second barrier metal film 126 provided between the via 128 and the first interconnect 122, is also advantageous in that the second barrier metal film 126 is more readily to separate from the first interconnect 122, and thereby the site of disconnection 140 may more readily be formed between the second barrier metal film 126 and the first interconnect 122.

In addition, in the state of disconnection, the electroconductive material composing the via 128 migrates together with the second barrier metal film 126, to thereby form the site of disconnection 140 between the second barrier metal film 126 and the first interconnect 122. As a consequence, the second barrier metal film 126 may successfully be prevented from establishing re-connection with the first interconnect 122 due to re-migration of the electroconductive material composed of a copper-containing metal film, even after the annealing and so forth are carried out in the later processes. In this way, the semiconductor device 100 may be improved in the heat resistance. Because the second barrier metal film 126 and the third barrier metal film 132 are doubly formed between the overflow portions 142 and the site of disconnection 140, migration of the electroconductive material may be prevented in a more effective manner.

Any attempt of disconnecting the electrical fuse 200 configured as explained in this embodiment, making use of a phenomenon such that the electroconductive material migrates based on electro-migration, may raise a difficulty in efficiently disconnecting the electrical fuse, because the electro-migration tends to be suppressed by the barrier metal films. In contrast, according to the crack-assisted disconnection of thus-configured electrical fuse 200, the electroconductive material in the process of disconnection of the electrical fuse 200 may be heated to an extremely high temperature, so that also the barrier metal film, composed of a refractory metal, may migrate enough to efficiently disconnect the electrical fuse 200, and may also be prevented from migrating in the later processes enough to effectively suppress the re-connection.

Because the electrical fuse 200 is disconnected by the above-described mechanism of crack-assisted type in this embodiment, the site of disconnection 140 is inevitably formed in the region different from the overflow portions 142. In this way, the electrical fuse 200 may successfully be prevented from re-connection.

FIGS. 10A and 10B are sectional views specifically showing another configuration of the semiconductor device 100 incorporated with the electrical fuse 200 shown in FIGS. 8A and 8B. FIG. 10A shows the state before disconnection, and FIG. 10B shows the state after disconnection. This configuration differs from the example shown in FIGS. 9A and 9B, in that the electrical fuse 200 herein has a dual-damascene structure.

In this example, the via 128 and the second interconnect 134 are formed in an integrated manner to give a dual-damascene interconnect 154. Before disconnection, the electrical fuse 200 is configured by the first interconnect 122, and the dual-damascene interconnect 154 (via 128 and second interconnect 134) electrically connected to the first interconnect 122. The via 128 is formed in the second etching stopper film 108, the second insulating interlayer 110 and the third etching stopper film 112. The second interconnect 134 is formed in the third etching stopper film 112, the third insulating interlayer 114 and the second protective film 116.

The dual-damascene interconnect 154 is configured as being covered, on the side wall and the bottom surface thereof, with a fifth barrier metal film 150. Also the fifth barrier metal film 150 may be configured by using a material same as that composing the second barrier metal film 126 and the third barrier metal film 132. In the state before disconnection, the fifth barrier metal film 150 is provided between the via 128 and the first interconnect 122 as being brought into contact with the both.

When an excessive power is applied to thus-configured electrical fuse 200, the electroconductive material composing the second interconnect 134 expands, and swells into the direction of the third insulating interlayer 114 which is a soft film. As the electroconductive material expands, the fifth barrier metal film 150 and so forth cause cracks therein, and the electroconductive material composing the second interconnect 134 bursts out into the third insulating interlayer 114. As a consequence, the overflow portions 142 are formed as shown in FIG. 10B.

In addition, because the electroconductive material abruptly migrates towards the overflow portions 142, the electroconductive material is disconnected at a site where the electroconductive material could not catch up with the migration. In this embodiment, the electroconductive material is disconnected at the via 128, and the site of disconnection 140 is formed therein. This embodiment, having the fifth barrier metal film 150 provided between the via 128 and the first interconnect 122, is also advantageous in that the fifth barrier metal film 150 is more readily to separate from the first interconnect 122, and thereby the site of disconnection 140 may more readily be formed between the fifth barrier metal film 150 and the first interconnect 122.

In addition, in the state of disconnection, the electroconductive material composing the via 128 migrates together with the fifth barrier metal film 150, to thereby form the site of disconnection 140 between the fifth barrier metal film 150 and the first interconnect 122. As a consequence, the fifth barrier metal film 150 may successfully be prevented from establishing re-connection with the first interconnect 122 due to re-migration of the electroconductive material composed of a copper-containing metal film, even after the annealing and so forth are carried out in the later processes. In this way, the semiconductor device 100 may be improved in the heat resistance.

The configuration in the above raises the effects below.

(1) Because the electrical fuse 200 is configured by a multi-layer structure, the electrical fuse may be arranged in the direction of stacking, and thereby the area for forming the electrical fuse may be reduced.

(2) Because the via is disconnected, probability of re-connection of the electroconductive material after disconnection may be reduced.

(3) The electrical fuse 200 assumed as being formed on a single plane may raise a risk such that the electroconductive materials, which should intrinsically be electrically disconnected, may undesirably be bridged by the overflow portions 142. Once such bridging should occur, the electrical fuse once disconnected may be re-connected through the overflow portions 142, and thereby yield of disconnection may degrade (low resistivity after disconnection), and the resistivity after disconnection may change (time-dependent changes). In this embodiment, such problem of bridging may be avoidable, because the site of disconnection 140 and the overflow portion 142 are formed in different layers.

By the way, as has been described in the above, in the process of disconnecting the electrical fuse 200 based on the crack-assisted mechanism, the electroconductive material composing the electrical fuse 200 deforms, and then bursts out with a large mass into the peripheral to form the overflow portions 142. In this process, the overflow portions 142 may undesirably be connected to the peripheral elements to thereby adversely affect them, and may cause short-circuiting. Therefore, in this embodiment, the guard metal was arranged around the electrical fuse 200, and in particular so as to extend beyond one end of the second interconnect 134. Paragraphs below will show still another configuration provided with a guard component capable of preventing short-circuiting, even when the overflow portions 142 should be formed on the lateral side, or on the lateral upper side of the second interconnect 134.

Figure 3A:
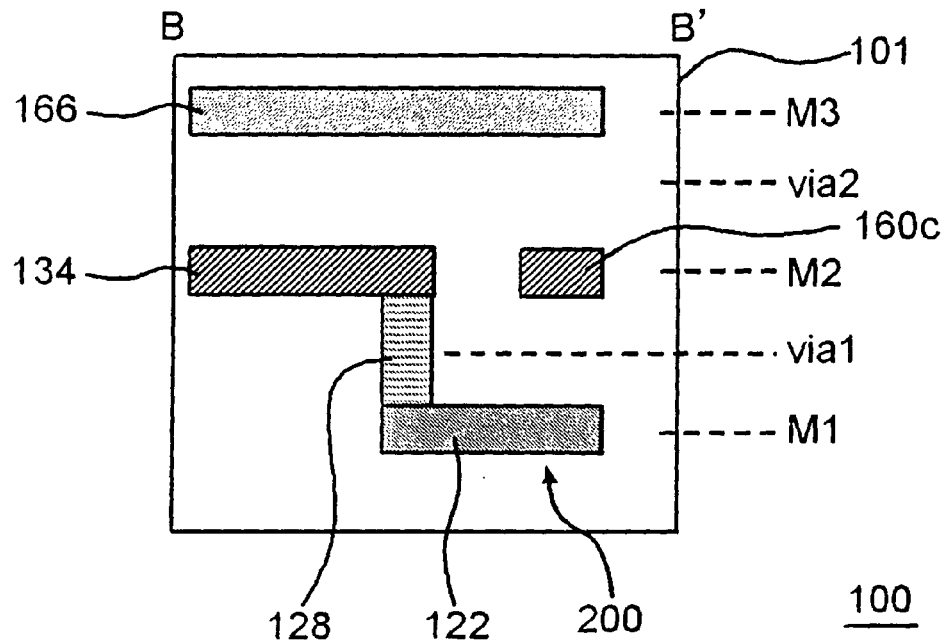
FIGS. 3A and 3B are sectional views taken along line B-B' in FIG. 1.
Figure 3B:
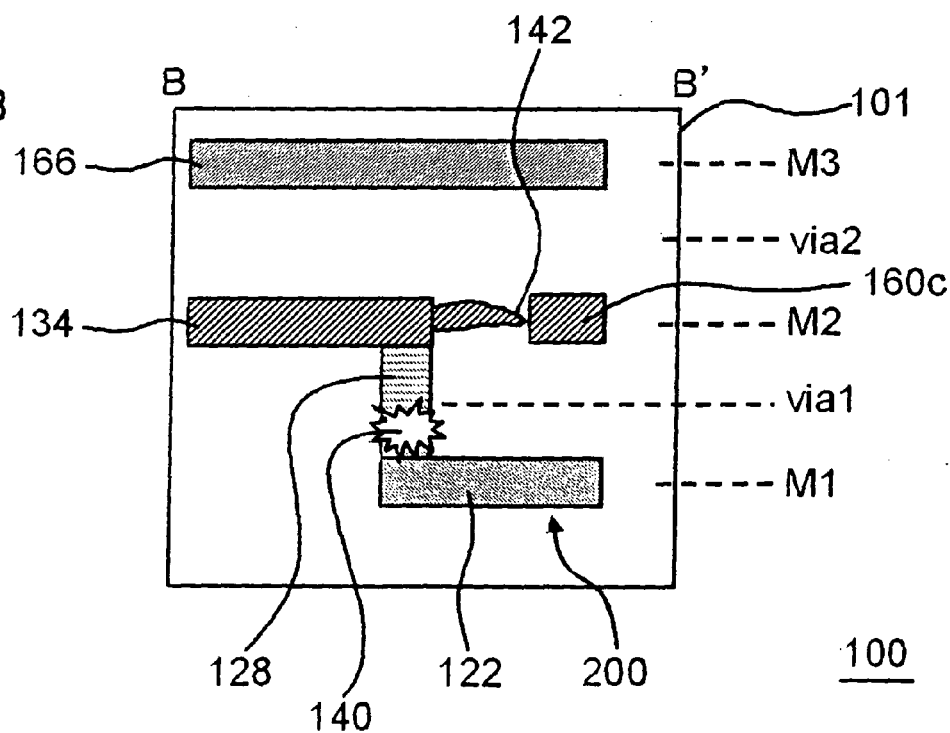

FIG. 1 is a schematic top view of a configuration of the semiconductor device 100 having a guard interconnect portion 160 provided around the electrical fuse 200. For simplicity of understanding, FIG. 1 does not show the insulating films. FIGS. 2A and 2B are sectional views taken along line A-A' in FIG. 1, and FIGS. 3A and 3B are sectional views taken along line B-B' in FIG. 1. FIG. 2A and FIG. 3A show the state before disconnection of the electrical fuse, and FIG. 2B and FIG. 3B show the state after disconnection of the electrical fuse.

Configuration of the electrical fuse 200 may be similar to that described referring to FIGS. 6, 7A, 7B, 8A, 8B, 9A, 9B, 10A and 10B. The via 128 in this embodiment is shown as being connected to one end of the second interconnect 134, wherein "one end" includes not only the end surface of one end of the second interconnect 134, but also includes a portion slightly distant from the end surface. In other words, the via 128 may be provided at a position slightly distant from the end surface of one end of the second interconnect 134. In addition, while not being specifically limited, it is not always necessary to form the first interconnect 122 and the second interconnect 134 as being wider than the diameter of the via 128 at the sites of connection with the via 128. More specifically, it may be necessary for the general multi-layer structure to make the interconnect wider at the site of connection with the via, in order to ensure electrical contact between the via and the interconnect, whereas the electrical fuse 200 of this embodiment does not specifically need such configuration.

The semiconductor device 100 further contains, in addition to the electrical fuse 200, the guard interconnect portion 160 formed in the same layer with the second interconnect 134, so as to surround one end of the second interconnect 134. As shown in FIG. 1, the second interconnect 134 herein is formed so as to extend from the other end towards one end, and the guard interconnect portion 160 is formed so as to surround such one end of the second interconnect 134 in three directions, while placing such one end at the center thereof.

More specifically, the guard interconnect portion 160 has a third interconnect 160a and a fourth interconnect 160b provided on both sides of the second interconnect 134, while being extended almost in parallel with the second interconnects 134, and long enough to extend beyond such one end of the second interconnect 134, and a fifth interconnect 160c provided ahead of such one end, opposite to the other end, of the second interconnect 134, while being extended almost normal to the second interconnect 134. In this embodiment, the guard interconnect portion 160 has a U-shape, in which the third interconnect 160a and the fourth interconnect 160b are connected via the fifth interconnect 160c.

According to this configuration, as shown in FIG. 2B, the overflow portions 142 are guarded by the fifth interconnect 160c even if they are formed so as to extend beyond one end of the second interconnect 134 in the process of disconnection of the electric fuse 200, so that the overflow portions 142 may effectively be prevented from causing short-circuiting with other elements and so forth.

Figure 11:
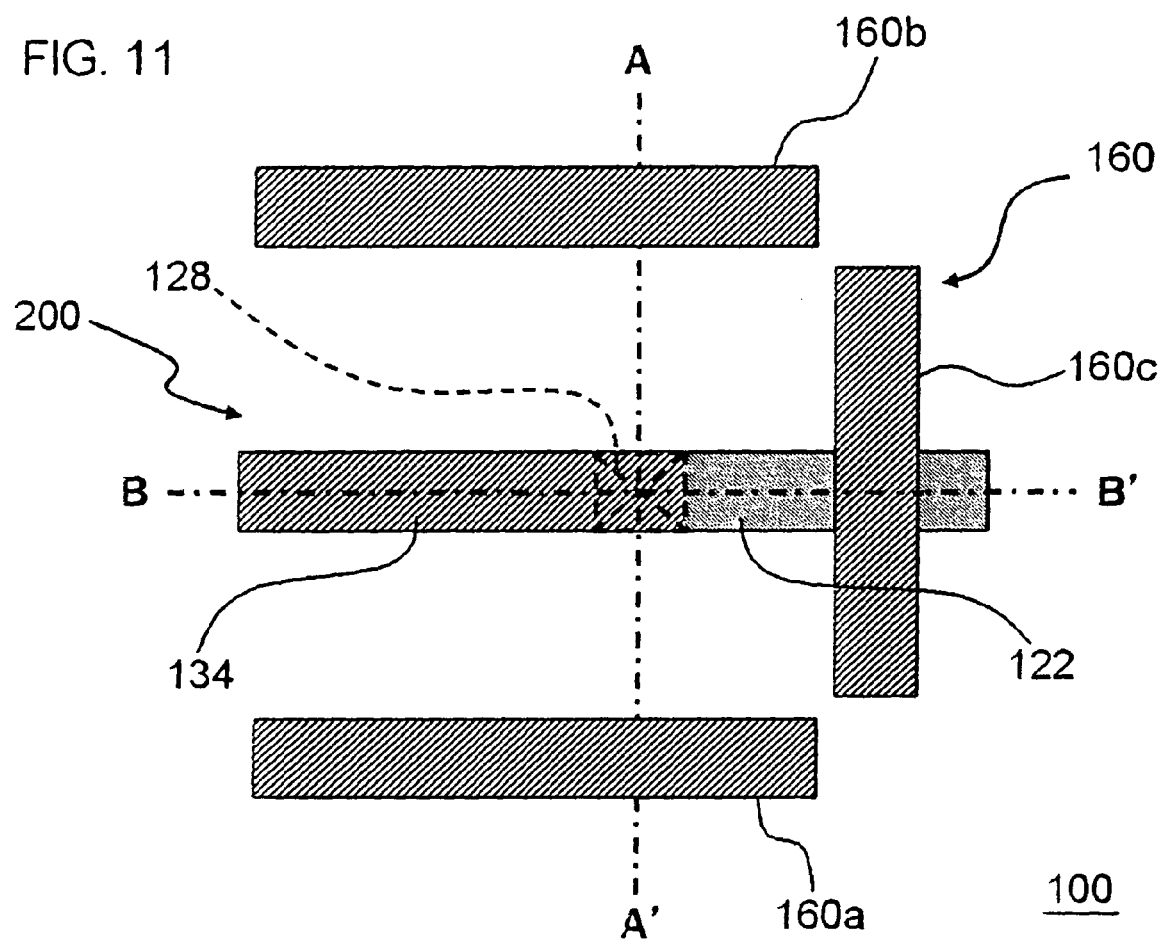
FIG. 11 is a schematic top view showing another exemplary configuration of the semiconductor device containing the electrical fuse according to the embodiment of the present invention.
Figure 12:
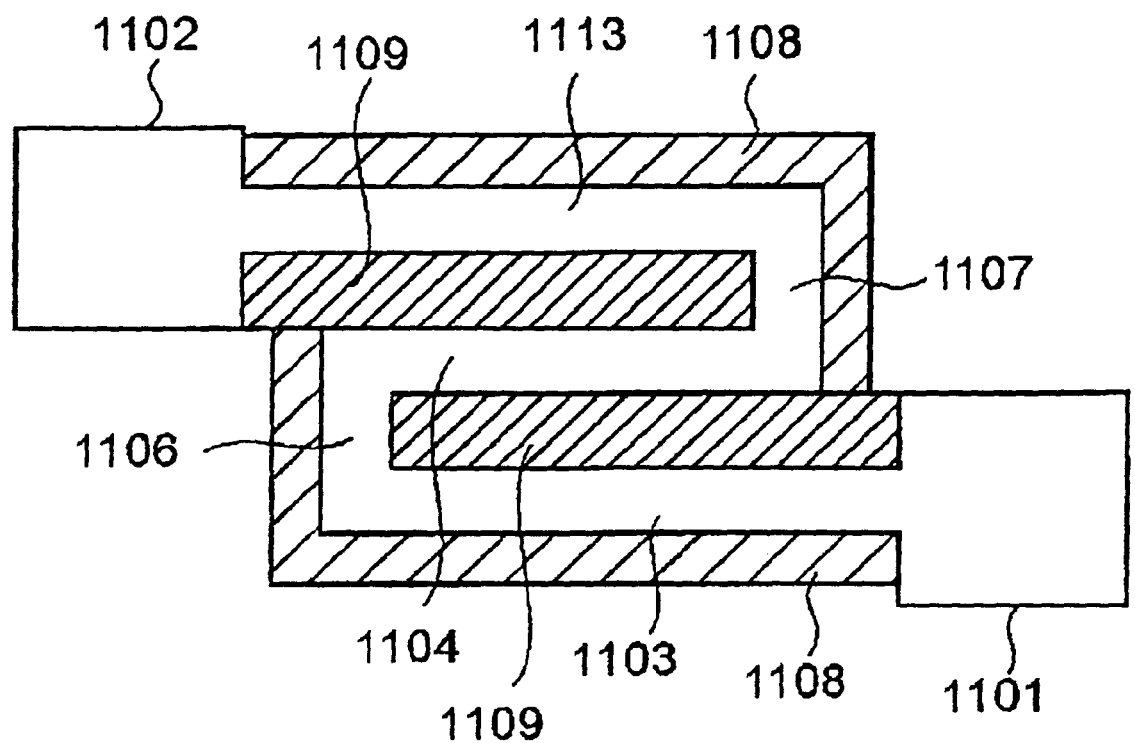
FIG. 12 is a top view showing an example of a conventional electrical fuse.

It is to be understood that the third interconnect 160a, the fourth interconnect 160b, and the fifth interconnect 160c may be good enough if they are configured as preventing the short-circuiting of the electrical fuse 200 with the peripheral elements through the overflow portions 142, and may therefore be not connected with each other, in still another embodiment typically as shown in FIG. 11. The similar effects may be obtained also in this case.

Still alternatively, as shown in FIGS. 2A and 2B, in this embodiment, the semiconductor device 100 contains a peripheral via 168a and a peripheral via 168b formed on the third interconnect 160a and the fourth interconnect 160b which are formed in an upper layer of the layer having the second interconnect 134 formed therein, while being respectively connected thereto, and a top plate 166 formed in the upper layer of the peripheral via 168a and the peripheral via 168b while being respectively connected thereto, and so as to cover the guard interconnect portion 160 in the plan view. According to this configuration, short-circuiting may be avoidable even when the overflow portions 142 are formed on the lateral side or on the lateral upper side of the second interconnect 134. Although the insulating film 101 herein is schematically illustrated as a single layer, the insulating film of the semiconductor device 100 may have a multi-layer structure, as has been explained referring to FIGS. 9A, 9B, 10A and 10B.

In this embodiment, the semiconductor device 100 further contains a sixth interconnect 162a and a seventh interconnect 162b formed in the same layer with the first interconnect 122, respectively under the third interconnect 160a and the fourth interconnect 160b; and a peripheral via 164a and a peripheral via 164b formed in the same layer with the via 128, so as to connect between the third interconnect 160a and the sixth interconnect 162a, and between the fourth interconnect 160b and the seventh interconnect 162b, respectively. According to this configuration, the short-circuiting due to overflow portions 142 may be prevented in a more reliable manner.

FIG. 4 is a top view showing a configuration of the individual layers.

A lowermost M1 layer has the first interconnect 122 formed therein. A via1 layer on the M1 layer has the via 128 formed therein. In an M2 layer on the via1 layer, the guard interconnect portion 160, containing the second interconnect 134, the third interconnect 160a, the fourth interconnect 160b and the fifth interconnect 160c, is formed. Although the drawing does not show the sixth interconnect 162a and the seventh interconnect 162b in the M1 layer, nor the peripheral via 164a and the peripheral via 164b in the via1 layer, the sixth interconnect 162a and the peripheral via 164a are provided at the position corresponded to the third interconnect 160a in the M2 layer, and the seventh interconnect 162b and the peripheral via 164b are provided at the position corresponded to the fourth interconnect 160b in the M2 layer, respectively.

Further in a via2 layer on the M2 layer, the peripheral via 168a and the peripheral via 168b are formed at the positions corresponded respectively to the third interconnect 160a and the fourth interconnect 160b in the M2 layer. In an M3 layer on the via2 layer, the top plate 166 is formed.

Figure 5:
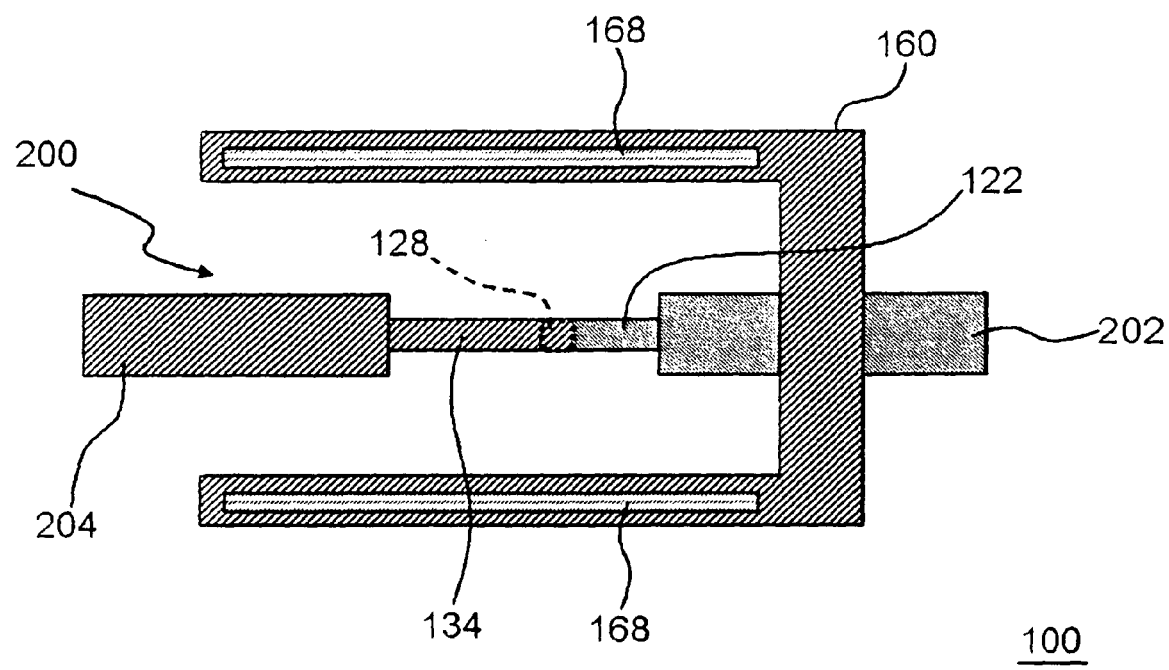
FIG. 5 is a top view showing a specific configuration of the semiconductor device shown in FIG. 1.

FIG. 5 is a top view showing a specific configuration of the semiconductor device 100 shown in FIG. 1.

The first interconnect 122 is connected at one end thereof to the via 128, and at the other end thereof to the first terminal 202. The second interconnect 134 is connected at one end thereof to the via 128, and at the other end thereof to the second terminal 204.

The first terminal 202 and the second terminal 204 may be formed as being wider than the first interconnect 122 and the second interconnect 134. For example, the first interconnect 122 and the second interconnect 134 may be 0.1 μm wide, and the first terminal 202 and the second terminal 204 may be 0.3 μm wide. Excessively widened interconnects may, however, promote heat radiation, so that provision of wide first terminal 202 and the second terminal 204 in the vicinity of the interconnect allowed for formation of the overflow portions may make the overflow portions less likely to be formed, or make the electrical fuse 200 less likely to disconnect. For this reason, the first terminal 202 and the second terminal 204 are formed as being wider than the first interconnect 122 and the second interconnect 134, the first terminal 202 and the second terminal 204 may be provided at positions distant by a certain distance away from the overflow portions and the site of disconnection. In addition, the first terminal 202 and the second terminal 204 may be formed as having a same width with the first interconnect 122 and the second interconnect 134.

As has been described in the above, the semiconductor device 100 containing an electrical fuse 200 in this embodiment may raise an effect of preventing short-circuiting in the process of disconnection of the electrical fuse 200, besides the effects shown in the above referring FIGS. 6, 7A, 7B, 8A, 8B, 9A, 9B, 10A and 10B.

The embodiments of the present invention have been described, referring to the attached drawings, merely as examples of the present invention, while allowing adoption of various configurations other than those described in the above.

The examples explained in the above were such as having the second interconnect 134 provided in the upper layer of the first interconnect 122, whereas the same will apply also to the case where the second interconnect 134 is provided in the lower layer of the first interconnect 122. In other words, by making the volume of the second interconnect 134 larger than that of the first interconnect 122, the overflow portions 142 may be formed to the second interconnect 134 even if the second interconnect 134 is provided in the lower layer. Also in this case, the guard interconnect portion 160 may be formed so as to surround one end of the second interconnect 134.

The embodiments in the above explained a configuration such as providing the guard interconnect portion 160 in the same layer with the second interconnect 134. However in another example, the guard interconnect portion, formed so as to surround one end of the first interconnect 122 connected to the via 128, may be provided to the same layer with the first interconnect 122. The guard interconnect portion in this case may be configured similarly to as the guard interconnect portion 160 described in the above.

The above-described embodiments have explained the cases of the crack-assisted disconnection of electrical fuse, whereas the present invention may be applicable also to the conventional cases where the electrical fuse is disconnected based on a phenomenon such that a material composing the fuse is disconnected by causing electro-migration.

It is apparent that the present invention is not limited to the above embodiment, that may be modified and changed without departing from the scope and spirit of the invention.

What is claimed is:

1. A semiconductor device, comprising:
  a substrate;
  an electrical fuse formed over said substrate, having a first interconnect and a second interconnect, respectively formed in different layers, and a via provided in a layer between said first interconnect and said second interconnect, the via being connected to one end of said second interconnect and connected also to said first interconnect; and
  a first guard interconnect, a second guard interconnect, and a third guard interconnect formed in the same layer with said second interconnect so as to surround said one end of said second interconnect,
  wherein, in a plan view, said second interconnect is formed so as to extend from an other end towards said one end, and said first guard interconnect, said second guard interconnect, and said third guard interconnect are formed so as to surround the one end of the second interconnect in three directions, and
  wherein a site of disconnection is formed in said via when the electrical fuse is blown.

2. The semiconductor device as claimed in claim 1, wherein said electrical fuse includes an electro-conductive material and
  is formed in at least one of a predetermined shape and size for a formation of an overflow portion of said electro-conductive material out from said second interconnect in a state of disconnection, and so that the site of disconnection forms between said first interconnect and said via, or in said via, in said state of disconnection.

3. The semiconductor device as claimed in claim 2, wherein said overflow portion is formed so as to extend beyond said one end of said second interconnect.

4. The semiconductor device as claimed in claim 2, wherein said electrical fuse further includes a first barrier metal film provided between said first interconnect and said via, and being brought into contact with the first interconnect and the via in a state before disconnection, and said site of disconnection is formed between said first barrier metal film and said first interconnect in the state of disconnection.

5. The semiconductor device as claimed in claim 4, wherein said second interconnect is provided in an upper layer of said first interconnect, and said second interconnect and said via have a dual-damascene interconnect structure.

6. The semiconductor device as claimed in claim 2, wherein said electrical fuse further contains a second barrier metal film provided as being brought into contact, in a state before disconnection, with a side face of said second interconnect, and
  in said state of disconnection, a crack is formed in said second barrier metal film, and said overflow portion is formed by said electroconductive material bursting out through said crack.

7. The semiconductor device as claimed in claim 2, wherein said second interconnect of said electrical fuse has a volume larger than that of said first interconnect.

8. The semiconductor device of claim 2, wherein said predetermined size comprises said second interconnect being formed larger than said first interconnect.

9. The semiconductor device of claim 2, wherein said layer in which is formed said second interconnect is softer than an adjacent layer in which is formed said via.

10. The semiconductor device as claimed in claim 1, wherein said second interconnect is provided in an upper layer of said first interconnect, and
  said second interconnect and said via have a dual-damascene interconnect structure.

11. The semiconductor device as claimed in claim 1, wherein said second interconnect of said electrical fuse has a volume larger than that of said first interconnect.

12. The semiconductor device as claimed in claim 1, wherein said electrical fuse is disconnected by allowing current to flow in the direction from said first interconnect through said via to said second interconnect.

13. The semiconductor device as claimed in claim 1, wherein a formation of said fuse into said two layers interconnected by said via is predetermined such that, during a process of disconnection of said fuse, an electroconductive material of said fuse will burst at said one end of said second interconnect and a site of disconnection of said electroconductive material within said fuse will thereby occur at a location different from said one end of said second interconnect.

14. An apparatus, comprising the semiconductor device of claim 1.

15. The semiconductor device of claim 1, further comprising:
  a first terminal connected to one end of said first interconnect, said one end being opposite to an end connected to said via; and
  a second terminal connected to an end of said second interconnect, said end being opposite to said one end connected to said via,
  wherein said first interconnect has a width narrower than that of said first terminal, and said second interconnect has a width narrower than that of said second terminal.

* * * * *